(12) United States Patent
Hasegawa

(10) Patent No.: US 7,239,196 B2
(45) Date of Patent: Jul. 3, 2007

(54) FILTER CIRCUIT

(75) Inventor: Yasumasa Hasegawa, Kanegawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/098,256

(22) Filed: Apr. 4, 2005

(65) Prior Publication Data
US 2005/0232101 A1 Oct. 20, 2005

(30) Foreign Application Priority Data
Apr. 5, 2004 (JP) .......................... P2004-111427

(51) Int. Cl.
*H03K 5/00* (2006.01)
(52) U.S. Cl. ...................... 327/552; 327/344; 327/558
(58) Field of Classification Search ........ 327/552–559, 327/336, 344, 308
See application file for complete search history.

(56) References Cited

U.S. PATENT DOCUMENTS

| | | | |
|---|---|---|---|
| 5,028,893 A * | 7/1991 | Marrah et al. ............... 333/173 |
| 5,523,712 A * | 6/1996 | Miyabe et al. ............... 327/355 |
| 5,793,243 A * | 8/1998 | Farrow ........................ 327/345 |
| 6,806,765 B2 * | 10/2004 | Giuroiu ....................... 327/553 |
| 2001/0033196 A1 * | 10/2001 | Lennous et al. ............ 327/552 |

OTHER PUBLICATIONS

S. Pavan, et al., *"High Frequency Continuous Time Filters in Digital CMOS"*, #5 "GM-OTA-C Filters", ISBN 0792377737 (Springer, 2000).

* cited by examiner

*Primary Examiner*—Dinh T. Le
(74) *Attorney, Agent, or Firm*—Sonnenschein Nath & Rosenthal LLP

(57) ABSTRACT

An R-2R resistor circuit network 12 used in a filter circuit according to the present invention has a path through which each branch current flows to a next integrating capacitor and a path through which each branch current flows to a low impedance analog midpoint (ground potential) Vss. The path can be selected by digital control bit data Bn to B0 for each branch current. By this, a frequency characteristic of a filter using an integrator as a component may be changed with an accuracy of $(\frac{1}{2}^{n+1})(Gm1)/Cf$ from $(\frac{1}{2}^{n+1})(Gm1)/Cf$ to $((2^{n+1}-\frac{1}{2}^{n+1})(Gm1)Cf$. As a result, by setting the setting bit width to 7 (n=6), a variable range of the frequency characteristic of over one hundredfold may be easily realized.

18 Claims, 8 Drawing Sheets

FILTER CIRCUIT

CROSS REFERENCES TO RELATED APPLICATIONS

The present invention contains subject matter related to Japanese Patent Application No. 2004-111427 filed in the Japan Patent Office on Apr. 5, 2004, the entire contents of which being incorporated herein by reference.

BACKGROUND OF THE INVENTION

1. Field of the Invention

The present invention relates to a filter circuit such as a continuous time analog integrated filter circuit, more particularly relates to a Gm-C (Transconductance-C) filter circuit having an integrator as a component, and to a method for realizing a system able to change the cutoff frequency, pole, or zero filter frequency characteristic up to over one hundredfold with a fine resolution of about 1% of a signal bandwidth.

2. Description of the Related Art

In the past, as analog integrated filters mainly using active elements, discrete time filters such as switched capacitor filters (SCFs) and continuous time filters such as transconductance-capacitor (Gm-C: Transconductance-C) filters have been widely applied.

A discrete time analog filter basically performs sampling operations using a clock. Its frequency characteristic is determined by a reference clock frequency having extremely small variation and fluctuation and further a ratio of capacitor values having good matching, so there is the advantage that a filter frequency characteristic having high precision is obtained. On the other hand, there are the defects that a prepositioned filter is required for preventing aliasing due to the sampling operation and that a broadband operational amplifier is necessary in order to realize circuit settling in a clock cycle, so, particularly in a high frequency filter, the power consumption tends to increase.

As opposed to this, a continuous time filter basically performs open loop operations like a Gm-C filter, is able to be configured without using an operational amplifier, and is suitable for higher speeds. It is also free from the problem of aliasing. For this reason, particularly for the purpose of a high speed filter, it can be said that a Gm-C filter or MOSFET-C filter or any other of the series of continuous time filters derived from them is suitable.

For example, in a system for reproduction of a signal from an optical disk such as a CD (compact disk) or DVD (digital versatile disk), an equalization filter is used for pre-processing for converting a reproduction signal to a digital signal. The above continuous time filter is used for this. The main purpose of this filter is to correct information of a bit pattern distorted in the optical-electric conversion path by using the frequency-gain characteristic of the filter and thereby reproduce a bit pattern sequence written on the disk with a low error rate.

A reproduction signal from an optical disk has a certain signal frequency bandwidth corresponding to a physical length of pits formed in the disk. On the other hand, the reproduction frequency per se changes in accordance with the rotational speed or linear speed of the disk at the time of reproduction. For example, when reproducing a signal by setting the disk rotational speed to two times normal, the reproduction signal at the same disk track doubles in frequency. In a CD, DVD, or other optical disk, for shortening the transfer time at the time of copying or buffering data between storage media, the general practice is to reproduce the signal at a speed of tens of times the reference reproduction frequency (in other words, disk rotational speed). At this time, it is necessary to also change the frequency characteristic of the equalization filter proportional to the disk rotational speed.

Specifically, the cutoff frequency of the equalization filter at the time of the reference reproduction of a CD (normal speed of CD) is about 0.7 MHz, the cutoff frequency at the time of the reference reproduction of a DVD (normal speed of DVD) becomes about 4 MHz, and the cutoff frequency at the time of 16× speed of a DVD becomes about 70 MHz. Accordingly, when desiring to realize a signal processing system able to reproduce a signal from a disk from the normal speed of a CD to 16× speed of a DVD by a common equalization filter, it is necessary for the cutoff frequency of the filter to be variable up to one hundredfold.

SUMMARY OF THE INVENTION

In such continuous time filters, however, the basic parameter determining the cutoff frequency, pole, or zero frequency characteristic is for example the gm/C (here, "gm" indicates the transconductor, while "C" indicates the integrating capacitor). The value of gm is determined by the inherited characteristic of the transconductance of the circuit element, that is, the transistor. In the case of for example a MOS transistor, a transconductance $gm_{MOS}$ of the transistor itself is expressed by the following equation:

$$Gm_{MOS} = 2K(V_{GS} - V_{TH}) \qquad (1)$$

That is, the fact that the gm of the integrator is variable up to one hundredfold just means that the transconductance $gm_{MOS}$ of the circuit element, that is, the transistor per se, is variable up to one hundredfold. Here, K is a constant, $V_{GS}$ is a gate-source bias potential, and $V_{TH}$ is a threshold voltage determined at the time of production.

As seen from the fact that K is usually expressed as $K = (1/2)\mu C_{OX}(W/L)$, K is determined from the physical size of the transistor, channel width W, and channel length L. The carrier mobility $\mu$ and gate oxide film capacitance $C_{OX}$ are invariable parameters in circuit design as values inherent to the devices.

In actuality, a transistor characteristic does not linearly change with respect to the channel length L, so gm-variable control using L is poor in controllability. Therefore, attempts have been made to fix the channel length L and make the channel width W variable to make the $gm_{MOX}$ variable. However, the transistor characteristic does not linearly follow W in the region from the lower limit value up to a few times the lower limit value in production, so the lower limit size usable as the transconductor ends up being naturally determined. It is substantially impossible to change the physical size W at the time of circuit operation after production, therefore, in actuality, circuits having a certain reference size are created and, as shown in FIG. 1, are operated in parallel to obtain whole multiples of gm. However, for example, if desiring to impart a variable range of gm of one hundredfold as described above, the number of parallel reference size circuits would becomes enormous. Particularly, the increase of the parasitic capacitance due to the parallel arrangement would make the control of the integrator capacitance value per se difficult.

On the other hand, the variable range of $V_{GS}$ is about 2× to 5× at most. The lower limit of $V_{GS}$ is determined by a distortion characteristic (or input dynamic range), while the upper limit is determined by a power supply voltage and a bias setting permitted from the circuit configuration. Further, the characteristic of the gm with respect to $V_{GS}$ is not linear in actuality. Usually, as shown in FIG. 2, the method is employed of making the bias current of the transconductor Gm variable by a digital-analog converter (DAC) etc.

It is substantially impossible to change the integrator capacitance C at the time of circuit operation after production in the same way as the above W, therefore connections of reference capacitances prepared in parallel in advance are appropriately switched by a switch etc. to change the basic parameter gm/C. In this case as well, the variable range of the capacitance value means the variable range of the device size and results in an increase of the parasitic capacitance and an increase of the overall device size.

Further, there is also the technique of simultaneously changing above K, $V_{GS}$, and C, but due to the nonlinearity with respect to the gm value including also the change of the parasitic capacitance, it becomes extremely difficult to linearly change the gm value and accordingly the cutoff frequency, pole, and zero frequency characteristic. As a result, it becomes difficult to realize the desired objective of setting the filter frequency characteristic at a desired value while considering temperature changes, power supply voltage fluctuations, and variation among devices.

Further, as previously explained, a reproduction signal from an optical disk has a certain signal frequency bandwidth corresponding to the physical length of the pits etc. formed in the disk. For example, when the reproduction medium (for example CD or DVD) is determined and the disk rotational speed at the time of reproduction is determined, the reproduction signal frequency has a bandwidth of about 4 to 5 times the reference. As an example, at 16× speed of a DVD, the reproduction signal has a signal bandwidth of about 16 MHz to 70 MHz. The effect of waveform shaping by the equalization filter changes according to the set cutoff frequency of the filter. Setting the frequency at increments of about 1% of the bandwidth is regarded as necessary. The increment for setting the frequency becomes about 0.5 MHz in the example of the 16× speed of a DVD, while becomes about 5 kHz at the normal speed of a CD. For this reason, it is not only difficult, but also undesirable to make the reproduction speed variable up to the maximum reproduction signal frequency (70 MHz here) by the typically considered minimum frequency increments (about 5 kHz here). A system where the frequency increments are proportional to the reception signal band, that is, able logarithmic linear setting, is desirable.

From the above, in the past, for applications requiring a variable range of frequency characteristic up to over one hundredfold like CD, DVD, or other optical disk reproduction systems, providing a plurality of equalization filters and switching among them resulted in an increase of the circuit scale and complication of the signal processing.

Due to the above, a mechanism has been desired which is able to make the cutoff frequency, pole, and zero filter frequency characteristic variable up to one hundredfold with a fine resolution of about 1% of the signal bandwidth by a simple method without a remarkable increase of the overall circuit scale for a continuous time analog integrated filter, particularly a filter having an integrator using a transconductor Gm and a capacitor C as a component, and further a mechanism in which the steps of variation of the frequency are proportional to the filter frequency characteristic, that is, the steps of variation of frequency are logarithmically linear with respect to the filter frequency characteristic.

It is therefore desirable to provide a filter circuit able to make the filter frequency characteristic variable up to over one hundredfold with a fine resolution of about 1% of the signal bandwidth and having steps of variation of frequency proportional to the filter frequency characteristic by a simple method without a great increase of the overall circuit scale.

According to a first embodiment of the present invention, there is provided a filter circuit having a transconductor for outputting a current proportional to an input voltage, a resistor circuit network for making a frequency characteristic of an output current of the transconductor variable with a precision of a bit width of (n+1) in accordance with (n+1) bit frequency characteristic setting bit data, an operational transconductance amplifier having an input terminal connected to a current output line of the resistor circuit network, and an integrating capacitor connected between an input terminal and an output terminal of the operational transconductance amplifier, wherein the resistor circuit network includes (n+1) number of branch nodes formed on a current propagation line for propagating the output current of the transconductor, n number of first resistor elements each connected between two of the (n+1) branch nodes, (n+1) number of second resistor elements having first ends connected to the corresponding branch nodes, a third resistor element connected between a last branch node and a low impedance analog midpoint potential, and (n+1) number of switch circuits for connecting the corresponding second ends of the second resistor elements to the current output line or low impedance analog midpoint potential in accordance with the corresponding bit data of the (n+1) bit frequency characteristic setting bit data, resistance values of the second and third resistor elements being set to several times the resistance value of the first resistor elements.

Preferably, the transconductor, resistor circuit network, operational transconductance amplifier, and integrating capacitor have differential configurations, and the common-mode potential from the output of the transconductor through the resistor circuit network and the input of the operational transconductance amplifier is set by a common-mode feedback circuit provided at the output portion of the transconductor.

According to a second embodiment of the present invention, there is provided a filter circuit having a transconductor for outputting a current proportional to an input voltage, a resistor circuit network for making a frequency characteristic of an output current of the transconductor variable with a precision of a bit width of (n+1) in accordance with (n+1) bit frequency characteristic setting bit data, a current follower having an input terminal connected to a current output line of the resistor circuit network, and an integrating capacitor connected to the output terminal of the current follower, wherein the resistor circuit network includes (n+1) number branch nodes formed on a current propagation line for propagating the output current of the transconductor, n number of first resistor elements each connected between two of the (n+1) branch nodes, (n+1) number of second resistor elements having first ends connected to the corresponding branch nodes, a third resistor element connected between the last branch node and a low impedance analog midpoint potential, and (n+1) number of switch circuits for connecting corresponding second ends of the second resistor elements to the current output line or low impedance analog midpoint potential in accordance with the corresponding bit data of the (n+1) bit frequency characteristic setting bit data, the resistance values of the second and third resistor elements being set to several times the resistance value of the first resistor elements.

Preferably, the transconductor, resistor circuit network, current follower, and integrating capacitor have differential configurations, and the common-mode potential from the output of the transconductor through the resistor circuit network and the input of the current follower is set by the common-mode potential of the input terminal of the current follower.

According to a third embodiment of the present invention, there is provided a filter circuit having a transconductor for outputting a current proportional to an input voltage, a resistor circuit network for making a frequency characteristic of an output current of the transconductor variable with a precision of a bit width of (n+1) in accordance with (n+1) bit frequency characteristic setting bit data, a current follower having an input terminal connected to a current output line of the resistor circuit network, an operational transconductance amplifier having an input terminal connected to the output terminal of the current follower, and an integrating capacitor connected between the input terminal and the output terminal of the operational transconductance amplifier, wherein the resistor circuit network includes (n+1) number of branch nodes formed on a current propagation line for propagating the output current of the transconductor, n number of first resistor elements each connected between two of the (n+1) branch nodes, (n+1) number of second resistor elements having first ends connected to the corresponding branch nodes, a third resistor element connected between the last branch node and a low impedance analog midpoint potential, and (n+1) number of switch circuits for connecting corresponding second ends of the second resistor elements to the current output line or low impedance analog midpoint potential in accordance with the corresponding bit data of the (n+1) bit frequency characteristic setting bit data, resistance values of the second and third resistor elements being set to several times the resistance value of the first resistor elements.

Preferably, the transconductor, resistor circuit network, current follower, operational transconductance amplifier, and integrating capacitor have differential configurations, and the common-mode potential from the output of the transconductor through the resistor circuit network and the input of the current follower is set by the common-mode potential of the input terminal of the current follower.

Further, preferably, the switch circuit of the resistor circuit network includes an analog switch having a field effect transistor.

Preferably, the switch circuit and the first, second, and third resistor elements of the resistor circuit network are formed by analog switches having field effect transistors and channel resistance of the field effect transistors.

Preferably, the low impedance analog midpoint potential is formed by a differentially low impedance connection in differential signals by short-circuiting a positive node and a negative node after branching.

According to the present invention, current is divided to a second resistor element having a resistance value 2R and a first resistor element having a resistance value R connected to for example an N-th (N=n) branch node. The current flowing through the second resistor element is selectively propagated to the input terminal of the operational transconductance amplifier through the low impedance analog midpoint potential or current output line via a switch circuit independently switched by the N-th control bit data Bn.

On the other hand, the current flowing through the first resistor element having the resistance value R is further divided to a second resistor element having the resistance value 2R and a first resistor element having the resistance value R connected to the next (N−1)th branch node. The current flowing through the second resistor element is selectively propagated to the input terminal of the operational transconductance amplifier through the low impedance analog midpoint potential or the current output line via a switch circuit independently switched by the (N−1)th control bit data Bn−1.

On the other hand, the current flowing through the first resistor element having the resistance value R is further divided to a second resistor element having the resistance value 2R and a first resistor element having the resistance value R connected to the next (N−2)th branch node. The current flowing through the second resistor element is selectively propagated to the input terminal of the operational transconductance amplifier through the low impedance analog midpoint potential or the current output line via a switch circuit independently switched by the (N−2)th control bit data Bn−2.

By sequentially repeating this, the current is divided to a second resistor element having the resistance value 2R and a third resistor element having the resistance value 2R connected to the last branch node. The current flowing through the second resistor element is selectively propagated to the input terminal of the operational transconductance amplifier through the low impedance analog midpoint potential or the current output line via a switch circuit independently switched by the control bit data $B_0$.

On the other hand, the current flowing through the third resistor element is propagated to the low impedance analog midpoint potential as it is.

The integrating capacitor is connected between the input and output terminals of the operational transconductance amplifier. By appropriately switching connections by the control bit data Bn to $B_0$, a signal current flowing into the integrating capacitor from the transconductor and consequently the frequency characteristic is made variable by a width and precision of N+1 bits.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, an explanation will be given of embodiments of the present invention with reference to the drawings.

First Embodiment

Figure 1:
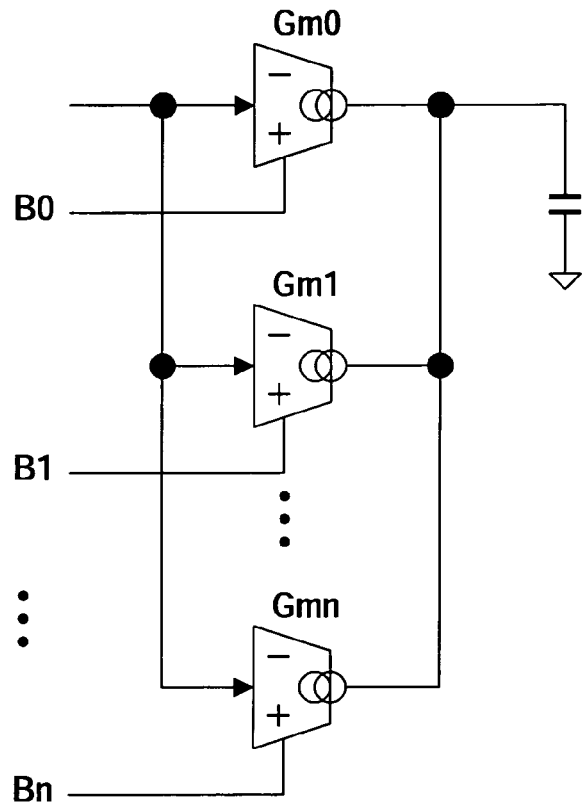
FIG. 1 is a diagram for explaining a first example of a method of variation of a frequency characteristic in the related art.
Figure 2:
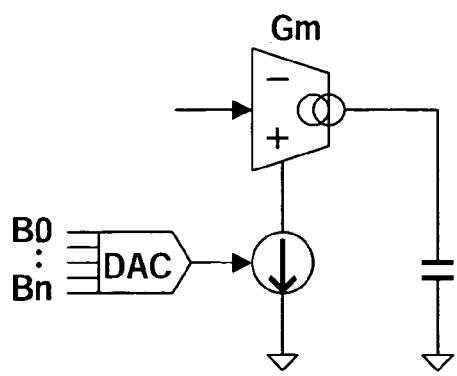
FIG. 2 is a diagram for explaining a second example of a method of variation of a frequency characteristic in the related art.
Figure 3:
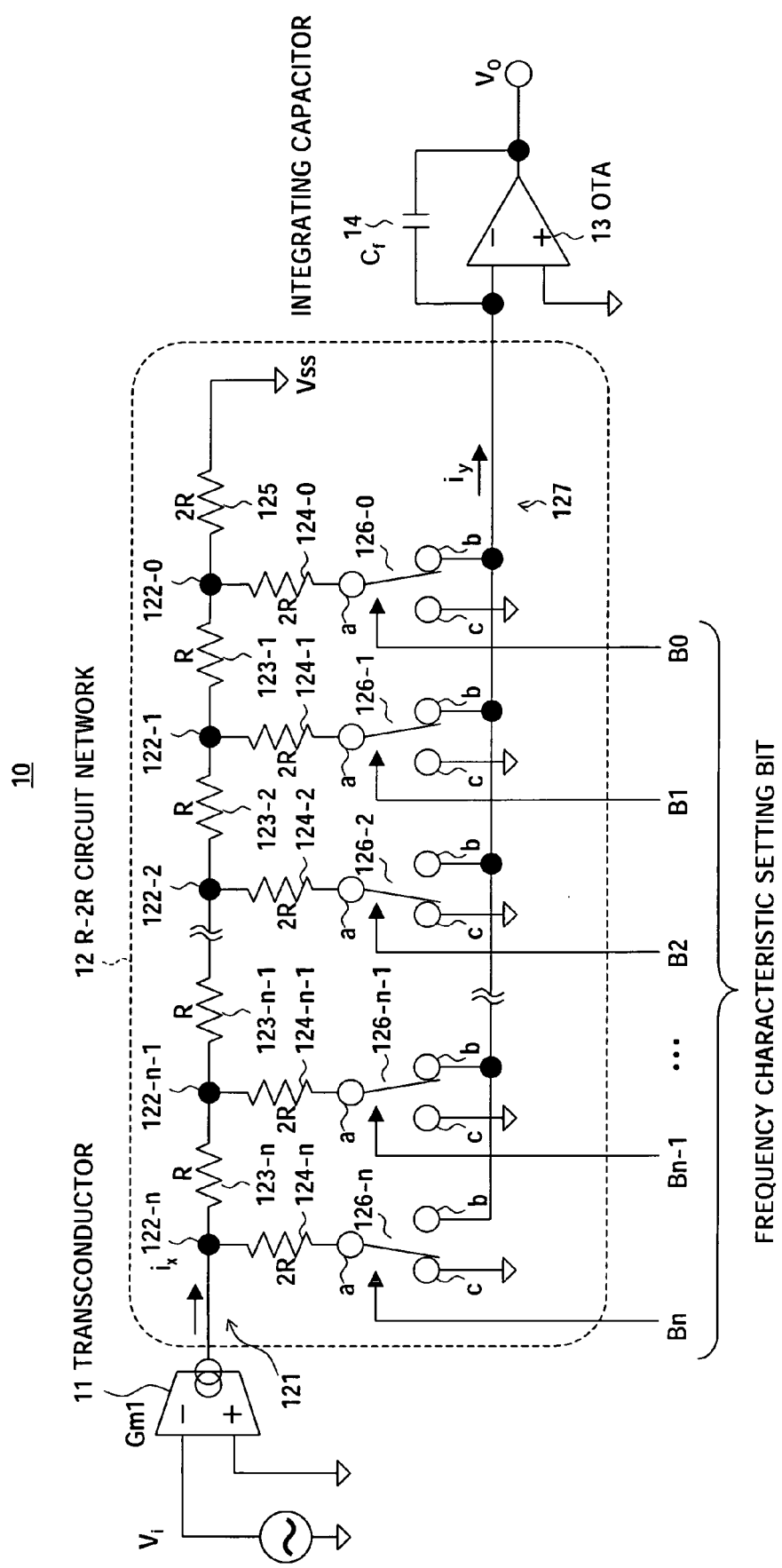
FIG. 3 is a circuit diagram of a filter circuit according to a first embodiment of the present invention.

FIG. 3 is a circuit diagram of a filter circuit according to a first embodiment of the present invention.

The filter circuit 10 has, as shown in FIG. 3, a transconductor (Gm1) 11 outputting a current $i_x$ proportional to an input voltage Vi, an R-2R resistor circuit network 12 able to change the frequency characteristic of the output current of the transconductor with a precision of a bit width of (n+1) in accordance with (n+1) bit frequency characteristic setting bit data, an operational transconductance amplifier (hereinafter referred to as an "OTA") 13 having an input terminal connected to the current output line of the R-2R resistor circuit network 12, and an integrating capacitor (Cf) 14 connected between the input terminal (−) and the output terminal of the OTA 13. Note that n is an integer of 1 or more.

The R-2R resistor circuit network 12 includes, as shown in FIG. 3, (n+1) number of branch nodes 122-n to 122-0 formed on a current propagation line 121 for propagating the output current $i_x$ of the transconductor 11, n number of first resistor elements 123-n to 123-1 connected among the branch nodes 122-n to 122-0, (n+1) number of second resistor elements 124-n to 124-0 having first ends connected to corresponding branch nodes 122-n to 122-1, a third resistor element 125 connected between the last branch node 122-0 and the low impedance analog midpoint potential (ground potential Vss), and (n+1) number of switch circuits 126-n to 126-0 selectively connecting corresponding second ends 124-n to 124-0 of the second resistor elements to the current output line 127 or the low impedance analog midpoint potential Vss by the corresponding bit data of the (n+1) bit frequency characteristic setting bit data Bn to $B_0$.

The resistance values of the first resistor elements 123-n to 123-1 are set at R, while the resistance values of the second resistor elements 124-n to 124-0 and the third resistor element 124 are set at 2R or two times the resistance value R of the first resistor elements 123-n to 123-1.

More specifically, the first resistor element R123-n is connected between the branch nodes 122-n and 122-n-1, the first resistor element R123-n-1 is connected between the branch nodes 122-n-1 and 122-n-2, and the first resistor element R123-1 is connected between the branch nodes 122-1 and 122-0.

One end of the second resistor element 124-n is connected to the branch node 122-n, and the other end is connected to a fixed contact a of the switch circuit 126-n. One end of the second resistor element 124-n-1 is connected to the branch node 122-n-1, and the other end is connected to the fixed contact a of the switch circuit 126-n-1. In the same way as above, one end of the second resistor element 124-2 is connected to the branch node 122-2, and the other end is connected to the fixed contact a of the switch circuit 126-2. One end of the second resistor element 124-1 is connected to the branch node 122-1, and the other end is connected to the fixed contact a of the switch circuit 126-1. One end of the second resistor element 124-0 is connected to the branch node 122-0, and the other end is connected to the fixed contact a of the switch circuit 126-0.

Operation contacts b of the switch circuits 126-n to 126-0 are connected to the current output line 127, and operation contacts c are connected to the low impedance analog midpoint potential (ground potential) Vss.

In such a configuration, the output current of the transconductor 11 is divided to the second resistor element 124-n having the resistance value 2R and the first resistor element 123-n having the resistance value R connected to the N (N=n)-th branch node 122-n. The current flowing through the second resistor element 124-n is selectively propagated via the switch circuit 126-n independently switched by the N-th control bit data Bn to the input terminal (−) of the OTA 13 through the low impedance analog midpoint potential or current output line 127.

On the other hand, the current flowing through the first resistor element 123-n having the resistance value R is further divided to second resistor element 124-n-1 having the resistance value 2R and the first resistor element 123-n-1 having the resistance value R connected to the next (N−1)th branch node 122-n-1. The current flowing through the second resistor element 124-n-1 is selectively propagated via the switch circuit 126-n-1 independently switched by the (N−1)th control bit data Bn−1 to the input terminal (−) of the OTA 13 through the low impedance analog midpoint potential or current output line 127.

On the other hand, the current flowing through the first resistor element 123-n-1 having the resistance value R is further divided to the second resistor element 124-n-2 having the resistance value 2R and the first resistor element 123-n-2 having the resistance value R connected to the next (N−2)th branch node 122-n-2. The current flowing through the second resistor element 124-n-2 is selectively propagated via the switch circuit 126-n-2 independently switched by the (N−2)th control bit data Bn−2 to the input terminal (−) of the OTA 13 through the low impedance analog midpoint potential or current output line 127.

By sequentially repeating this, the current is divided to the second resistor element 124-0 having the resistance value 2R and the third resistor element 125 having the resistance value 2R connected to the 0-th branch node 122-n-2. The current flowing through the second resistor element 124-0 is selectively propagated via the switch circuit 126-0 independently switched by the 0-th control bid data $B_0$ to the input terminal (−) of the OTA 13 through the low impedance analog midpoint potential or current output line 127.

On the other hand, the current flowing through the third resistor element 125 is propagated as it is to the low impedance analog midpoint potential.

The integrating capacitor 14 is connected between the input and output terminals of the OTA 13. By appropriately switching the connections of the 0-th to N-th control bit data Bn to $B_0$, the signal current flowing into the integrating capacitor 14 from the transconductor (Gm) 11 and consequently the frequency characteristic is made variable by the width and precision of N+1 bits.

In this way, in the R-2R resistor circuit network 12, there is a path through which each branch current flows to the next integrating capacitor 14 and a path through which each branch current flows to the low impedance analog midpoint potential (ground potential) Vss. The path can be selected by the digital control bit data Bn to $B_0$ for each branch current.

Here, the set bit width (n+1) may be any width. As an example, in the figure, when the set bit width is 5 (n=4), B4=B2=B0=0 and B3=B1=1, so a current $i_y$ flowing into the integrating capacitor 14 becomes equal to $(10/32)i_x$.

That is, in this case, by setting the digital control bit data Bn to $B_0$, setting at increments of $(1/32)i_x$ from $(1/32)i_x$ to $(31/32)i_x$ is enabled.

This indicates that the unity gain frequency of this integrator and consequently the frequency characteristic of a filter having this integrator as component may be changed with an accuracy of $(1/32)(Gm1)/Cf$ from $(1/32)(Gm1)/Cf$ to $(31/32)(Gm1)/Cf$.

If generalizing this, the unity gain frequency of an integrator is expressed by the following equation:

$$\omega_0 = \frac{Gm1}{C_f} \sum_{i=0}^{n} 2^{i-n-1} Bi, \ (Bi = 0, 1)$$

This indicates that the filter frequency characteristic may be changed with an accuracy of $(1/2^{n+1})(Gm1)/Cf$ from $(1/2^{n+1})(Gm1)/Cf$ up to $((2^{n+1}-1)/2^{n+1}))(Gm1)/Cf$.

Accordingly, by setting the set bit width at 7 (n=6) at most, a variable range of the frequency characteristic of over one hundredfold may be easily realized.

Namely, by configuring the filter by using an integrator as a component (Gm-R2R-OTA-C filter), it is possible to realize a filter which can change the cutoff frequency, pole, and zero filter frequency characteristic up to over one hundredfold with a fine resolution of about 1% of the signal bandwidth by a simple and convenient method without remarkably increasing the overall circuit scale.

Figure 4:
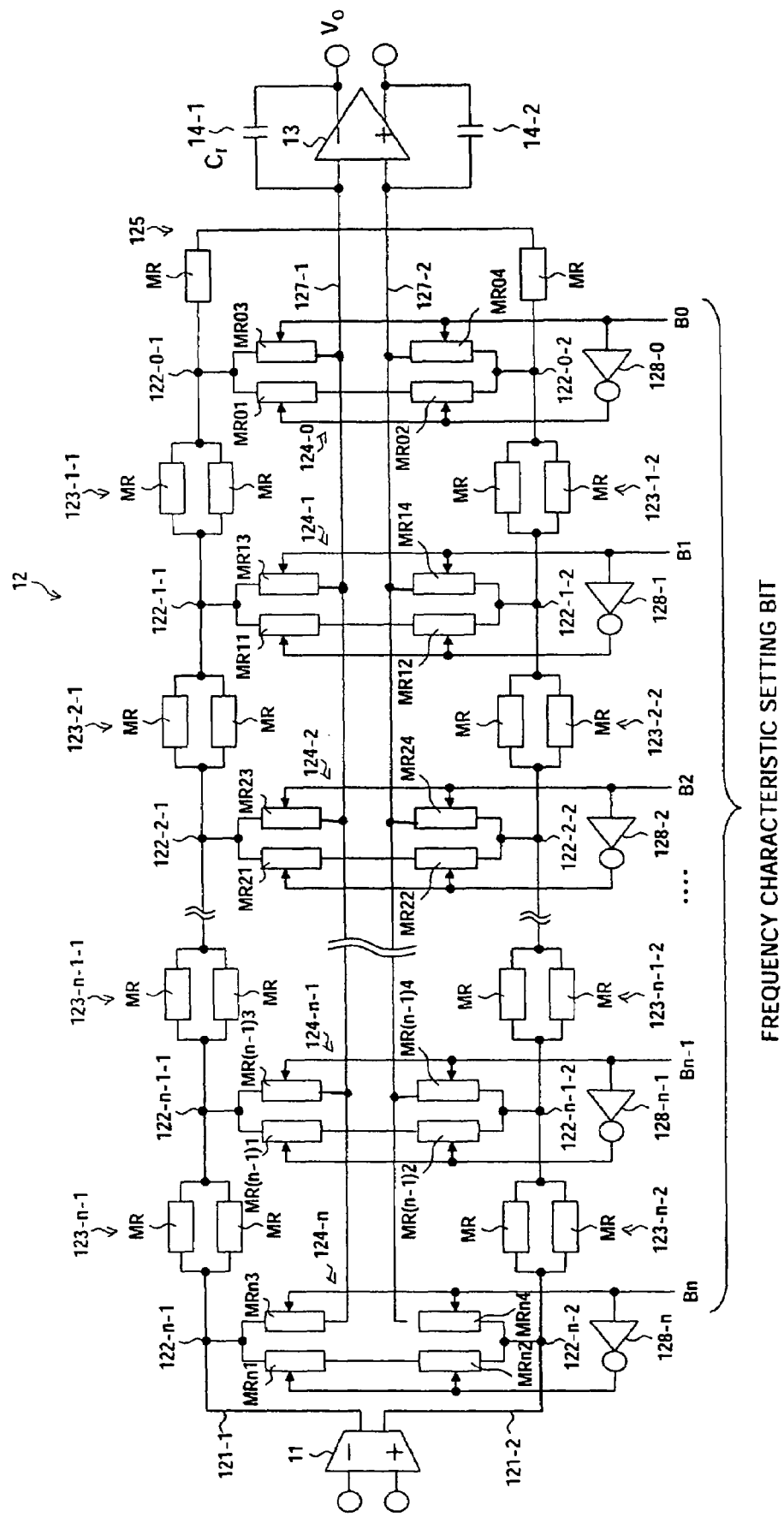
FIG. 4 is a circuit diagram of the filter circuit of FIG. 3 given a differential configuration.

Further, while the circuit filter was shown here by a single end configuration for simplification, in practical use, it is configured by for example an equivalent differential circuit as shown in FIG. 4.

In this case, the transconductor (Gm1) 11 is provided with a common feedback circuit, and the output common-mode potential of the transconductor 11 and consequently the input common-mode potentials of the R-2R resistor circuit network 12 and the OTA 13 are set at desired potentials.

Further, in the case of a differential configuration, the low impedance analog midpoint (ground potential) of one of the current dividing paths of the R-2R resistor circuit network 12 may short-circuit a positive side current division path and a negative side current division path. It is not necessary to clearly connect it to the low impedance DC node.

Further, here, as the most practical example, the resistors configuring the R-2R are realized by the channel resistance of the MOS switches of insulating gate type field effect transistors as will be explained later.

In FIG. 4, notation MR indicates a MOS switch having a channel resistance R. The MOS switch is configured by an n-channel MOS transistor.

In the case of a differential configuration, provision is made of the current propagation lines 121-1 and 121-2 and the current output lines 127-1 and 172-2.

Accordingly, provision is also made of the branch nodes 122-n-1 to 122-0-1 and 122-n-2 to 122-0-2, the first resistor elements 123-n-1 to 123-0-1 and 123-n-2 to 123-0-2, and the second resistor elements 124-n-1 to 124-0-1 and 124-n-2 to 124-0-2.

The switch circuit and the second resistor elements arranged in each branch path are formed so as to share four MOS switches MRn1 to MRn4 functioning also as analog switches.

Specifically, the second resistor element 124-n connects the two MOS switches MRn1 and MRn2 having the resistance value R in series between the N-th branch node 122-n-1 of the current propagation line 121-1 and the N-th branch node 122-n-2 of the current propagation line 121-2, connects a MOS switch MRn3 between the branch node 122-n-1 and the current output line 127-1, and connects a MOS switch MRn4 between the branch node 122-n-2 and the current output line 127-2.

The digital control bit data Bn is supplied through an inverter 128-n to gate terminals of the MOS switches MRn1 and MRn2 and directly supplied to gate terminals of the MOS switches MRn3 and MRn4 without going through the inverter 128-n.

By this, a low impedance analog midpoint is realized by short-circuiting the positive side current division path and the negative side current division path by the MOS switches MRn1 and MRn2 in accordance with the digital control bit data Bn, the current propagated through the current propagation line 121-1 via the MOS switch MRn3 is selectively propagated to the input terminal (−) of the OTA 13 through the current output line 127-1, and the current propagated through the current propagation line 121-2 via the MOS switch MRn4 is selectively propagated to the input terminal (+) of the OTA 13 through the current output line 127-2.

The second resistor element 124-n-1 connects the two MOS switches MR(n−1)1 and MR(n−1)2 having the resistance value R in series between the (N−1)th branch node 122-n-1-1 of the current propagation line 121-1 and the (N−1)th branch node 122-n-1-2 of the current propagation line 121-2, connects a MOS switch MR(n−1)3 between the branch node 122-n-1-1 and the current output line 127-1, and connects a MOS switch MR(n−1)4 between the branch node 122-(n−1)-2 and the current output line 127-2.

The digital control bit data Bn−1 is supplied through an inverter 128-n-1 to gate terminals of the MOS switches MR(n−1)1 and MR(n−1)2 and directly supplied to gate terminals of the MOS switches MR(n−1)3 and MR(n−1)4 without going through the inverter 128-n-1.

By this, a low impedance analog midpoint is realized by short-circuiting the positive side current division path and the negative side current division path by the MOS switches MR(n−1)1 and MR(n−1)2 in accordance with the digital control bit data Bn−1, the current propagated through the current propagation line 121-1 via the MOS switch MR(n−1)3 is selectively propagated to the input terminal (−) of the OTA 13 through the current output line 127-1, and the current propagated through the current propagation line 121-2 via the MOS switch MR(n−1)4 is selectively propagated to the input terminal (+) of the OTA 13 through the current output line 127-2.

In the same way as above, the second resistor element 124-2 connects the two MOS switches MR21 and MR22 having the resistance value R in series between the second branch node 122-2-1 of the current propagation line 121-1 and the second branch node 122-2-2 of the current propagation line 121-2, connects a MOS switch MR23 between the branch node 122-2-1 and the current output line 127-1, and connects a MOS switch MR24 between the branch node 122-2-2 and the current output line 127-2.

The digital control bit data B2 is supplied through an inverter 128-2 to gate terminals of the MOS switches MR21 and MR22 and directly supplied to gate terminals of the MOS switches MR23 and MR24 without going through the inverter 128-2.

By this, a low impedance analog midpoint is realized by short-circuiting the positive side current division path and the negative side current division path by the MOS switches MR21 and MR22 in accordance with the digital control bit data B2, the current propagated through the current propagation line 121-1 via the MOS switch MR23 is selectively propagated to the input terminal (−) of the OTA 13 through the current output line 127-1, and the current propagated through the current propagation line 121-2 via the MOS switch MR24 is selectively propagated to the input terminal (+) of the OTA 13 through the current output line 127-2.

The second resistor element 124-1 connects the two MOS switches MR11 and MR12 having the resistance value R in series between the second branch node 122-1-1 of the current propagation line 121-1 and the second branch node 122-1-2 of the current propagation line 121-2, connects a MOS switch MR13 between the branch node 122-1-1 and the current output line 127-1, and connects a MOS switch MR14 between the branch node 122-1-2 and the current output line 127-2.

The digital control bit data B1 is supplied through an inverter 128-1 to gate terminals of the MOS switches MR11 and MR12 and directly supplied to gate terminals of the MOS switches MR13 and MR14 without going through the inverter 128-1.

By this, a low impedance analog midpoint is realized by short-circuiting the positive side current division path and the negative side current division path by the MOS switches MR11 and MR12 in accordance with the digital control bit data B1, the current propagated through the current propagation line 121-1 via the MOS switch MR13 is selectively propagated to the input terminal (−) of the OTA 13 through the current output line 127-1, and the current propagated through the current propagation line 121-2 via the MOS switch MR14 is selectively propagated to the input terminal (+) of the OTA 13 through the current output line 127-2.

The second resistor element 124-0 connects the two MOS switches MR01 and MR02 having the resistance value R in series between the second branch node 122-0-1 of the current propagation line 121-1 and the second branch node 122-0-2 of the current propagation line 121-2, connects a MOS switch MR03 between the branch node 122-0-1 and the current output line 127-1, and connects a MOS switch MR04 between the branch node 122-0-2 and the current output line 127-2.

The digital control bit data B0 is supplied through an inverter 128-0 to gate terminals of the MOS switches MR01 and MR02 and directly supplied to gate terminals of the MOS switches MR03 and MR04 without going through the inverter 128-0.

By this, a low impedance analog midpoint is realized by short-circuiting the positive side current division path and the negative side current division path by the MOS switches MR01 and MR02 in accordance with the digital control bit data B0, the current propagated through the current propagation line 121-1 via the MOS switch MR03 is selectively propagated to the input terminal (−) of the OTA 13 through the current output line 127-1, and the current propagated through the current propagation line 121-2 via the MOS switch MR04 is selectively propagated to the input terminal (+) of the OTA 13 through the current output line 127-2.

The third resistor element 125 is configured by connecting two MOS switches MR having the resistance value R between the 0-th branch node 122-0-1 of the current propagation line 121-1 and the 0-th branch node 122-0-2 of the current propagation line 121-2.

Namely, a low impedance analog midpoint (ground potential) is realized by short-circuiting the positive side current division path and the negative side current division path by the two MOS switches MR.

Further, as a known problem for the portion of the OTA-C, a feed forward path is formed by the feedback capacity C. The RHP-zero (Right Half Plane-zero) due to this degrades the high frequency characteristic.

This is a problem common to capacitive feedback. In order to solve this, in the past, a variety of methods such as Pole-Zero cancellation have been devised. These can be applied as they are to the OTA-C portion of the present invention.

For example, the system (FIG. 3.11–13) introduced in Pavan and Tsividis, "High Frequency Continuous Time Filters in Digital CMOS Processes", may also be applied to the present invention. Details thereof will not be discussed here. The gist of the present invention resides in making a virtual ground of the OTA input a current sink from the −2R resistor circuit network 12.

Second Embodiment

Figure 5:
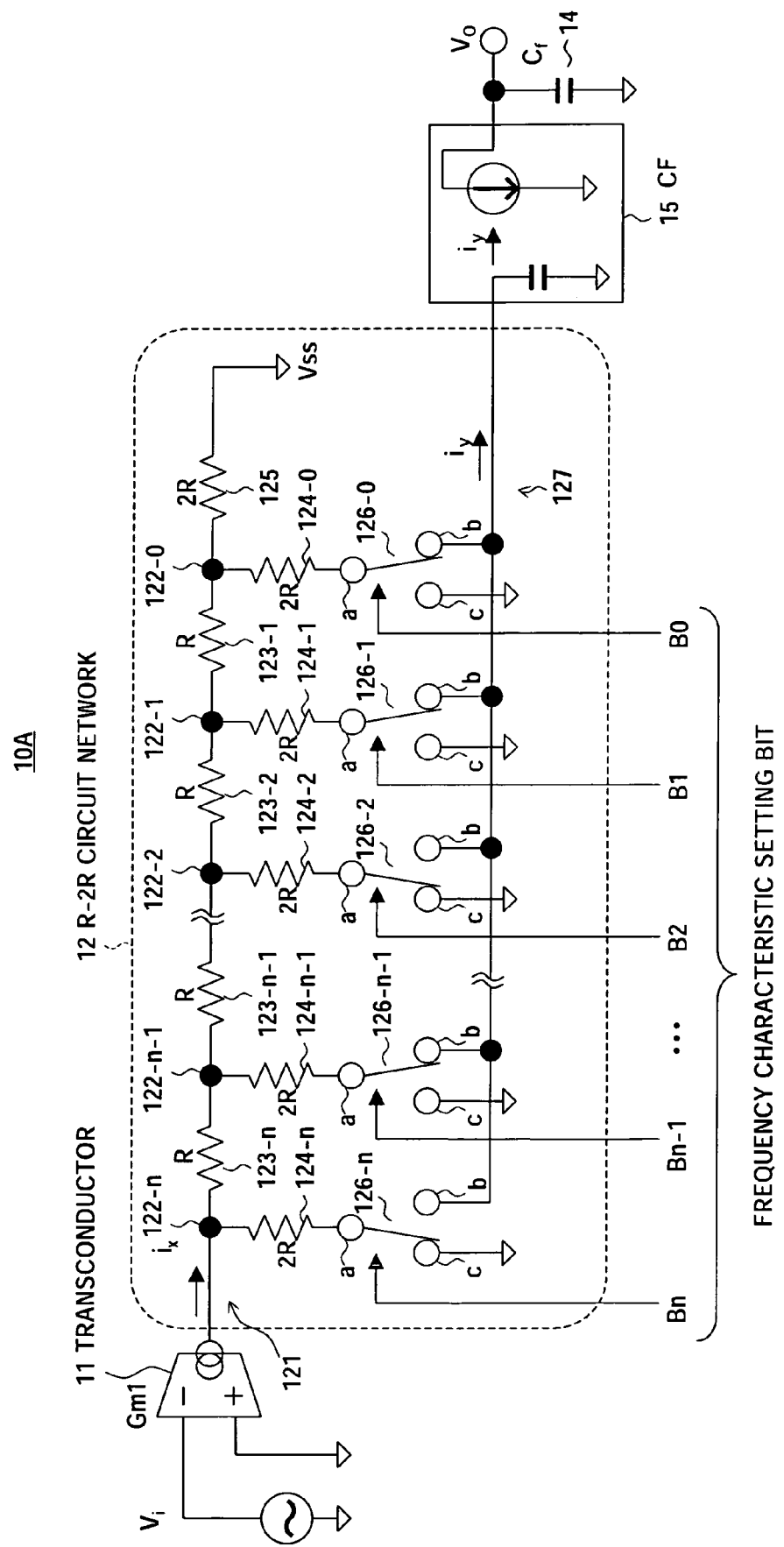
FIG. 5 is a circuit diagram of a filter circuit according to a second embodiment of the present invention.

FIG. 5 is a circuit diagram of a filter circuit according to a second embodiment of the present invention.

The difference of the filter circuit 10A according to the second embodiment from the filter circuit 10 according to the first embodiment resides in that the input terminal of the current follower 15 is connected in place of connecting the OTA to the current output line of the R-2R resistor circuit network 12 and that the integrating capacitor 14 is connected between the output terminal of the current follower (CF) 15 and the low impedance analog midpoint (ground potential).

In the second embodiment, in the R-2R resistor circuit network 12, there is a path through which each branch current flows to the next current follower 15 and a path through which it flows to a low impedance analog midpoint (ground potential). The path can be selected by the digital control bits Bn to $B_0$ for each branch current. Here, the set bit width n+1 may be any width. The setting method is the same as in the first embodiment.

Namely, if generalizing this, when the current gain of the current follower 15 is 1, the unity gain frequency of the integrator is expressed by the following equation:

$$\omega_0 = \frac{Gm1}{C_f} \sum_{i=0}^{n} 2^{i-n-1} Bi, (Bi = 0, 1)$$

This indicates that the filter frequency characteristic can be changed with an accuracy of $(\frac{1}{2}^{n+1})(Gm1)/Cf$ from $(\frac{1}{2}^{n+1})(Gm1)/Cf$ up to $((2^{n+1}-1)/2^{n+1}))(Gm1)/Cf$.

Accordingly, by setting the set bit width at 7 (n=6) at most, a variable range of the frequency characteristic of over one hundredfold may be easily realized.

Namely, by configuring the filter by using an integrator as a component (Gm-R2R-CF-C filter), it is possible to realize a filter which can change the cutoff frequency, pole, and zero filter frequency characteristic up to over one hundredfold with a fine resolution of about 1% of the signal bandwidth by a simple and convenient method without remarkably increasing the overall circuit scale.

Further, by making the input-output current ratio of the current follower, that is, the current gain variable, it is possible to further expand the variable range of the frequency characteristic.

Figure 6:
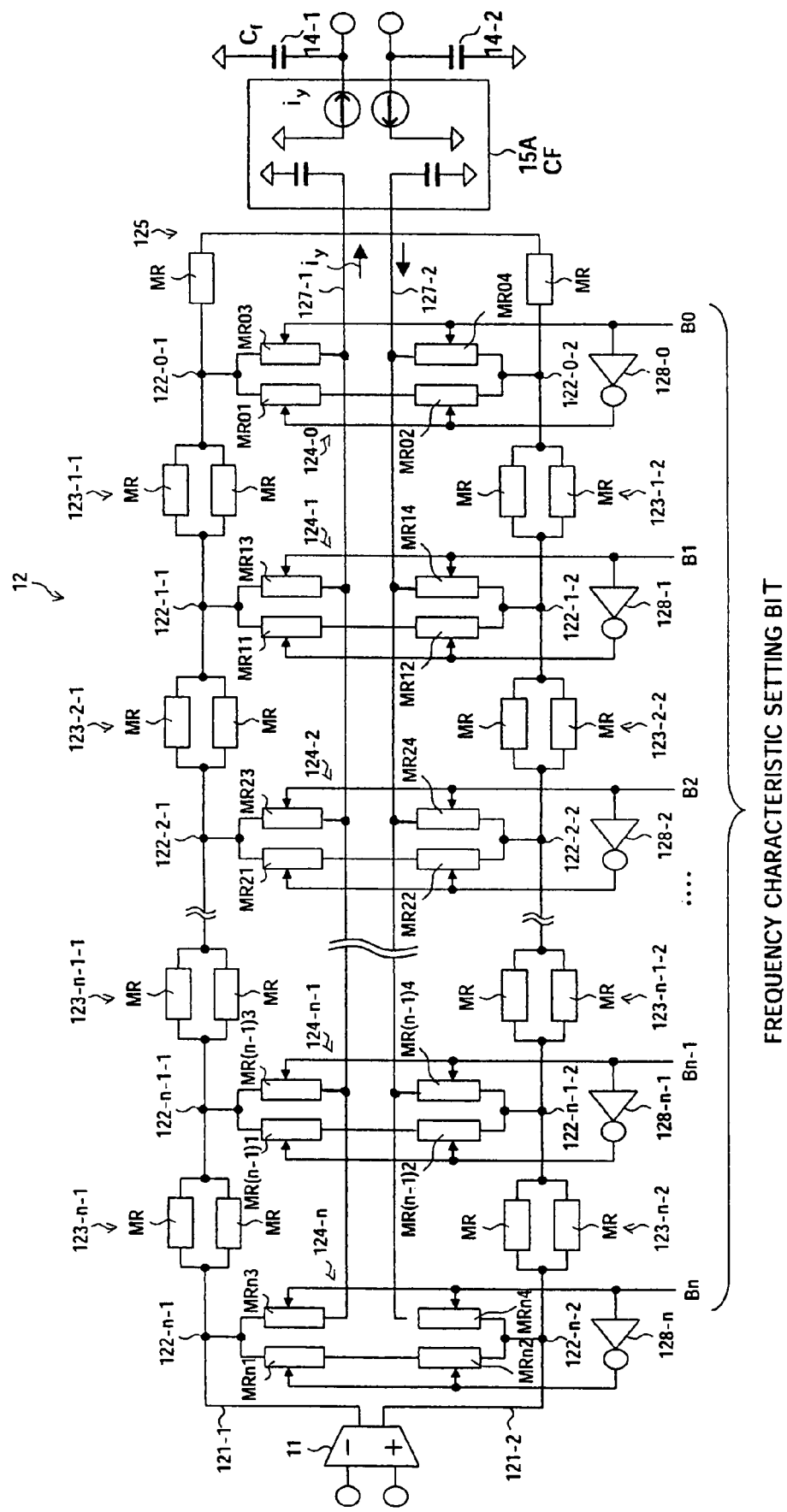
FIG. 6 is a circuit diagram of the filter circuit of FIG. 5 given a differential configuration.

Further, while the filter was shown here by a single end configuration for simplification, in the same way as the first embodiment, as shown in FIG. 6, it is practical to configure the same by a differential circuit equivalent to the single end configuration. In this case, the output common-mode potential of the transconductor (Gm1) 11 and the common-mode potential of the R-2R resistor circuit network 12 may be set by the low impedance input potential of the current follower 15.

Third Embodiment

Figure 7:
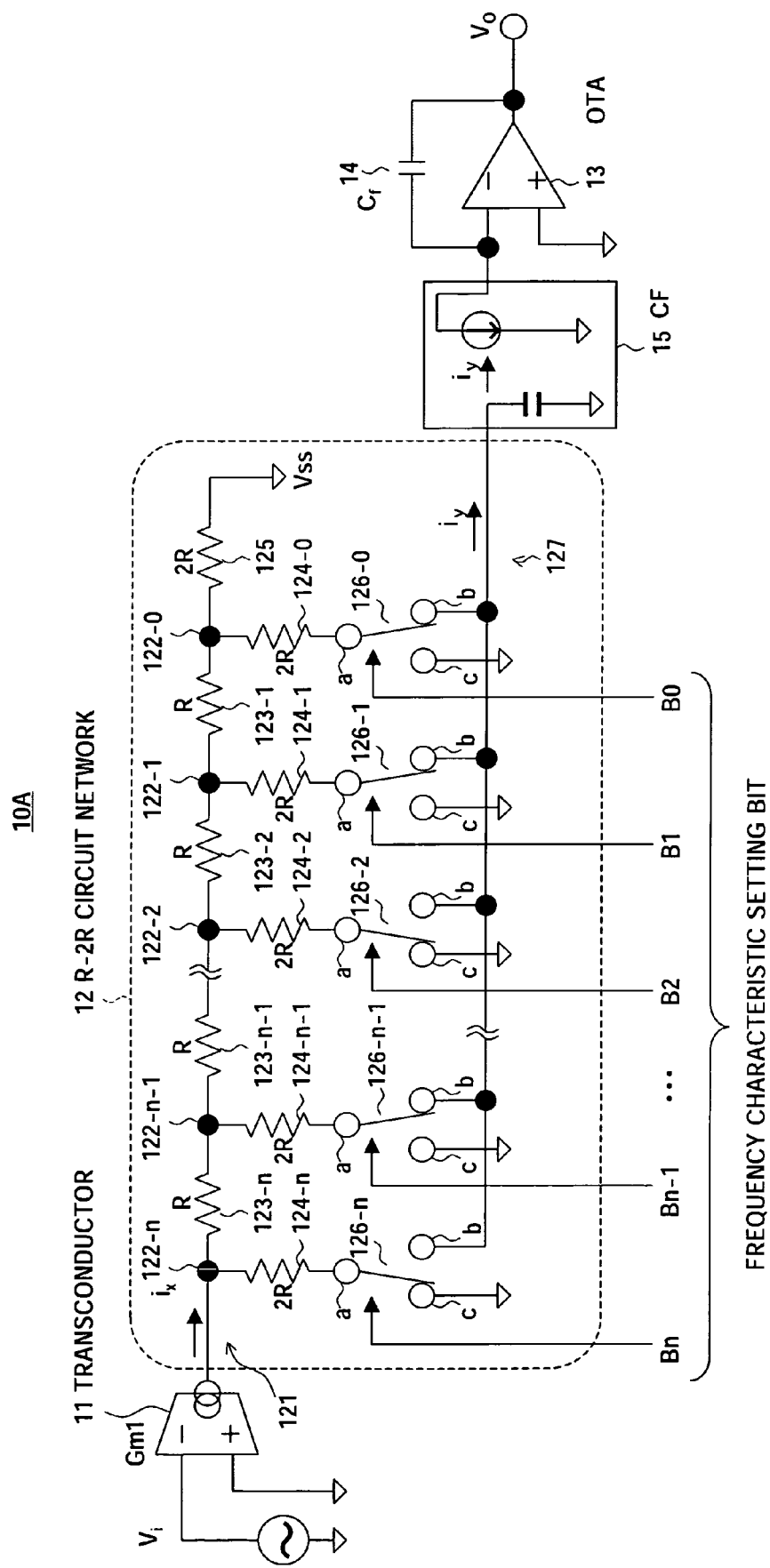
FIG. 7 is a circuit diagram of a filter circuit according to a third embodiment of the present invention.

FIG. 7 is a circuit diagram of a filter circuit according to a third embodiment of the present invention.

The third embodiment combines the first embodiment and the second embodiment.

Namely, it is also possible to realize the integrating capacitor portion of the second embodiment by the OTA-C as in the first embodiment (Gm-R2R-CF-OTA-C filter). Specifically, the input terminal of the OTA 13 is connected to the output terminal of the current follower 15, and the integrating capacitor 14 is connected between the input terminal and output terminal of the OTA 13.

The advantage of the third embodiment resides in that the input impedance may be sufficiently lowered by the current follower (CF) 15 and in addition the DC gain of the integrator may be set extremely large by the OTA 13, that is, it is possible to set the first pole frequency low. By this, even when the number of stages of R-2R is increased and the frequency characteristic is set low, a good integrating characteristic may be secured.

Further, the input impedance of the R-2R resistor circuit network 12 is R in all of the first to third embodiments, so the equivalent transconductance of the transconductor (Gm1) 11 may be expressed as $g_{m1}/((R/Z_{O1})+1)$.

Here, $Z_{O1}$ is the output impedance of the transconductor (Gm1) 11. From this, in order not to lower the equivalent transconductance and avoid the influence of fluctuation of the output impedance $Z_{O1}$, R is desirably sufficiently small with respect to $Z_{O1}$.

As a result, the R-2R resistor circuit network not clearly switch resistor elements, but realizing the switching by only channel resistance of the MOS switches per se can reduce the value of R, so is advantageous.

Further, at this time, the signal voltage amplitude at the output node of the transconductor (Gm1) 11 can be reduced. This is advantageous in the point that the channel resistance of the MOS switch can be simultaneously used in an amplitude region having a good linearity.

Figure 8:
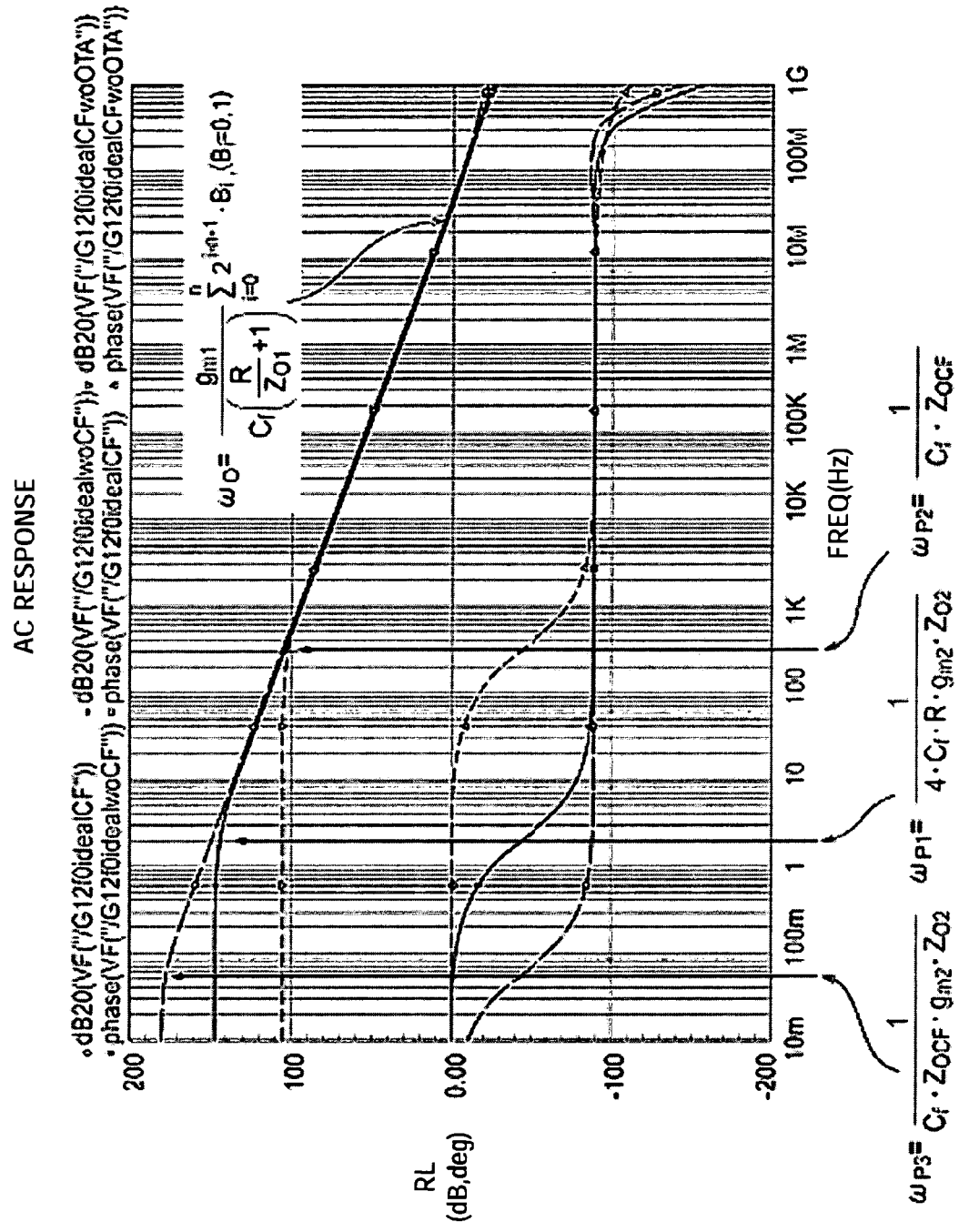
FIG. 8 is a diagram showing integrating characteristics and characteristic parameters of the first to third embodiments.

FIG. 8 is a diagram showing integrating characteristics and characteristic parameters of the first to third embodiments. In FIG. 8, the abscissa indicates the frequency (FREQ), and the ordinate indicates the relative level (RL).

Here, $\omega_0$ indicates the unity gain frequency, $\omega_{p1}$, $\omega_{p2}$, and $\omega_{p3}$ indicate first pole frequencies in the first, second, and third embodiments, $g_{m1}$ and $Z_{O1}$ indicate the transconductance of the initial stage transconductor and the output impedance, R indicates the input resistance of the 2-2R resistor circuit network, $Z_{OCF}$ indicates the output impedance of the current follower (CF) 15, $g_{m2}$ and $Z_{O2}$ indicate the transconductance of the OTA 13 and the output impedance, and Cf indicates the capacitance of the integrating capacitor.

Note that, this characteristic diagram shows an example of improving the high frequency phase characteristic of the OTA-C by Pole-Zero cancellation.

Figure 9:
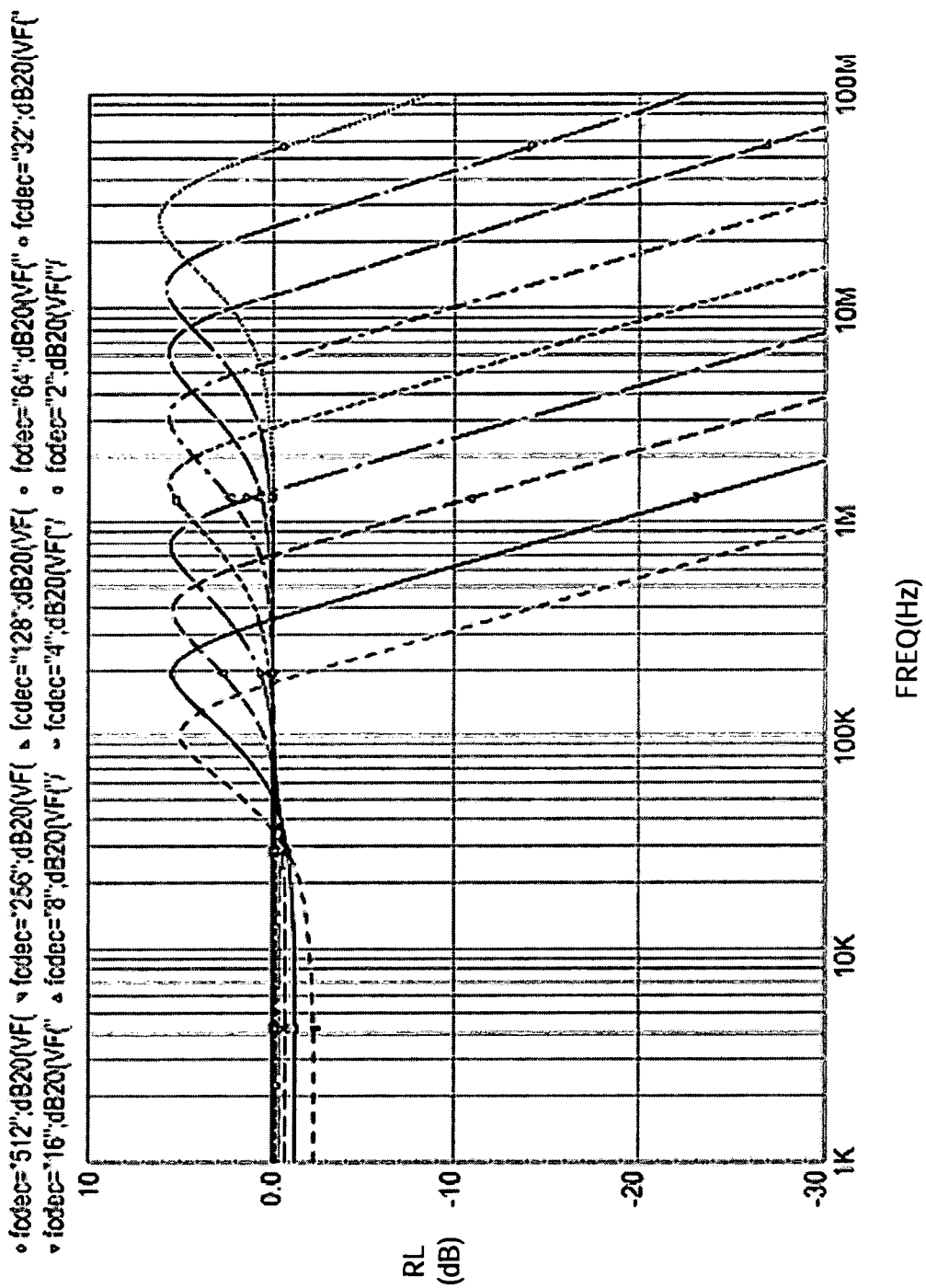
FIG. 9 is a diagram showing gain characteristics of equalization filters configured by integrators of embodiments of the present invention.

FIG. 9 is a diagram showing the gain characteristics of an equalization filter configured by an integrator according to an embodiment of the present invention. In FIG. 9, the abscissa indicates the frequency (FREQ), and the ordinate indicates the relative level (RL).

As seen from FIG. 9, a variable range of frequency characteristic of over one hundredfold may be easily obtained by setting the frequency characteristic control bits.

Note that the example of the figure shows a case where one among the frequency characteristic control bits is sequentially made 1 and all of the remaining bits are made 0 and where the step of variation of frequency becomes logarithmically linear with respect to the filter frequency characteristic. Naturally, by freely setting the control bits, as previously explained, the frequency characteristic can be changed with an accuracy of $(1/2^{n+1})(Gm1)/Cf$ from $(1/2^{n+1})(Gm1)/Cf$ up to $((2^{n+1}-1)/2^{n+1}))(Gm1)/Cf$.

It should be understood by those skilled in the art that various modifications, combinations, sub-combinations and alterations may occur depending on design requirements and other factors insofar as they are within the scope of the appended claims or the equivalents thereof.

What we claim is:

1. A filter circuit comprising:
   a transconductor for outputting an output current proportional to an input voltage;
   a resistor circuit network receiving the output current of said transconductor;
   an operational transconductance amplifier having an input terminal connected to a current output line of said resistor circuit network; and
   an integrating capacitor connected between an input terminal and an output terminal of said operational transconductance amplifier, wherein
   said resistor circuit network includes
   (n+1) number of branch nodes formed on a current propagation line for propagating the output current of said transconductor,
   n number of first resistor elements each connected between two of the (n+1) branch nodes,
   (n+1) number of second resistor elements having first ends connected to corresponding branch nodes,
   a third resistor element connected between a last branch node and a low impedance reference potential, and
   (n+1) number of switch circuits for connecting corresponding second ends of second resistor element to said current output line or low impedance reference potential in accordance with the corresponding bit data of (n+1) frequency characteristic setting bit data, which can be applied externally to the switch circuits,
   resistance values of said second and third resistor elements being set to several times the resistance value of said first resistor elements.

2. A filter circuit as set forth in claim 1, wherein a switch circuit of said resistor circuit network includes an analog switch having a field effect transistor.

3. A filter circuit as set forth in claim 1, wherein a switch circuit and first, second, and third resistor elements of said resistor circuit network are formed by analog switches having field effect transistors and channel resistance of the field effect transistors.

4. A filter circuit comprising:
   a transconductor for outputting a source and a sink current at its positive and negative output node respectively, such that said transconductor outputs a differential current proportional to an input differential voltage;
   a differential resistor circuit network receiving the differential output current of said transconductor;
   an operational transconductance amplifier having differential input terminals connected to differential current output lines of said differential resistor circuit network; and integrating capacitors one of which is connected between a positive input terminal and a negative output terminal, and the other is connected between a second negative input terminal and a second positive output terminal of said operational transconductance amplifier, wherein said resistor circuit network includes (n+1) number of positive branch nodes formed on a positive current propagation line for propagating the positive output current of said transconductor, (n+1) number of negative branch nodes formed on a negative current propagation line for propagating the negative output current of said transconductor, n number of first positive resistor elements each connected between two of the (n+1) positive branch nodes, n number of first negative resistor elements each connected between two of the (n+1) negative branch nodes, (n+1) number of second positive resistor elements having first ends connected to corresponding positive branch nodes, (n+1) number of second negative resistor elements having first ends connected to corresponding negative branch nodes, a third positive resistor element connected between a last positive branch node and a last common-mode potential, a third negative resistor element connected between a last negative branch node and said last common-mode potential, (n+1) number of positive switch circuits for connecting corresponding second ends of said second positive resistor elements to a positive current output line or a corresponding common-mode potential in accordance with the corresponding bit data of an (n+1) frequency characteristic setting bit data, which can be applied externally to the positive switch circuits, (n+1) number of negative switch circuits for connecting corresponding second ends of said second negative resistor elements to a negative current output line or said corresponding common-mode potential in accordance with the corresponding bit data of an (n+1) frequency characteristic setting bit data, which can be applied externally to the negative switch circuits, resistance values of said second positive-, second negative-, third positive-, and third negative-resistor elements being set to several times the resistance value of said first positive- and negative-resistor elements.

5. A filter circuit as set forth in claim 4, wherein a switch circuit of said resistor circuit network includes an analog switch having a field effect transistor.

6. A filter circuit as set forth in claim 4, wherein a switch circuit and first, second, and third resistor elements of said resistor circuit network are formed by analog switches having field effect transistors and channel resistance of the field effect transistors.

7. A filter circuit as set forth in claim 4, wherein said common-mode potential is formed by a differentially low impedance connection in differential signals by short-circuiting a positive node and a negative node after branching.

8. A filter circuit as set forth in claim 5, wherein said common-mode potential is formed by a differentially low impedance connection in differential signals by short-circuiting a positive node and a negative node after branching.

9. A filter circuit as set forth in claim 6, wherein said common-mode potential is formed by a differentially low impedance connection in differential signals by short-circuiting a positive node and a negative node after branching.

10. A filter circuit comprising:

a transconductor for outputting an output current proportional to an input voltage;

a resistor circuit network receiving the output current of said transconductor;

a current follower having an input terminal connected to a current output line of said resistor circuit network;

an operational transconductance amplifier having an input terminal connected to the output terminal of said current follower; and an integrating capacitor connected between the input terminal and the output terminal of said operational transconductance amplifier, wherein said resistor circuit network includes (n+1) number of branch nodes formed on a current propagation line for propagating the output current of said transconductor, n number of first resistor elements each connected between two of the (n+1) branch nodes, (n+1) number of second resistor elements having first ends connected to corresponding branch nodes, a third resistor element connected between a last branch node and a low impedance reference potential, and (n+1) number of switch circuits for connecting corresponding second ends of said second resistor elements to said current output line or low impedance reference potential in accordance with the corresponding bit data of the (n+1) bit frequency characteristic setting bit data, resistance values of said second and third resistor elements being set to several times the resistance value of said first resistor elements.

11. A filter circuit as set forth in claim 10, wherein a switch circuit of said resistor circuit network includes an analog switch having a field effect transistor.

12. A filter circuit as set forth in claim 10, wherein the switch circuit and first, second, and third resistor elements of said resistor circuit network are formed by analog switches having field effect transistors and channel resistance of the field effect transistors.

13. A filter circuit comprising:

a transconductor for outputting a source and a sink current at its positive and negative output node respectively, such that said transconductor outputs a differential current proportional to an input differential voltage;

a differential resistor circuit network receiving the differential output current of said transconductor;

a currently follower having differential input terminals connected to differential current output lines of said differential resistor circuit network;

an operational transconductance amplifier having differential input terminals connected to differential current output lines of said current follower; and integrating capacitors one of which is connected between a positive input terminal and a negative output terminal, and the other is connected between a second negative input terminal and a second positive output terminal of said operational transconductance amplifier, wherein said resistor circuit network includes (n+1) number of positive branch nodes formed on a positive current propagation line for propagating the positive output current of said transconductor, (n+1) number of negative branch nodes formed on a negative current propagation line for propagating the negative output current of said transconductor, n number of first positive resistor elements each connected between two of the (n+1) positive branch nodes, n number of first negative resistor elements each connected between two of the (n+1) negative branch nodes, (n+1) number of second positive resistor elements having first ends connected to corresponding positive branch nodes, (n+1) number of second negative resistor elements having first ends connected to corresponding negative branch nodes, a third positive resistor element connected between a last positive branch node and a last common-mode potential, a third negative resistor element connected between a last negative branch node and said last common-mode potential, (n+1) number of positive switch circuits for connecting corresponding second ends of said second positive resistor elements to a positive current output line or a corresponding common-mode potential in accordance with the corresponding bit data of an (n+1) frequency characteristic setting bit data, which can be applied externally to the positive switch circuits, (n+1) number of negative switch circuits for connecting corresponding second ends of said second negative resistor elements to a negative current output line or said corresponding common-mode potential in accordance with the corresponding bit data of an (n+1) frequency characteristic setting bit data, which can be applied externally to the negative switch circuits, resistance values of said second positive-, second negative-, third positive-, and third negative-resistor elements being set to several times the resistance value of said first positive- and negative-resistor elements.

14. A filter circuit as set forth in claim 13, wherein a switch circuit of said resistor circuit network includes an analog switch having a field effect transistor.

15. A filter circuit as set forth in claim 13, wherein the switch circuit and first, second, and third resistor elements of said resistor circuit network are formed by analog switches having field effect transistors and channel resistance of the field effect transistors.

16. A filter circuit as set forth in claim 13, wherein said common-mode potential is formed by a differentially low impedance connection in differential signals by short-circuiting a positive node and a negative node after branching.

17. A filter circuit as set forth in claim 14, wherein said common-mode potential is formed by a differentially low impedance connection in differential signals by short-circuiting the positive node and the negative node after branching.

18. A filter circuit as set forth in claim 15, wherein said common-mode potential is formed by a differentially low impedance connection in differential signals by short-circuiting the positive node and the negative node after branching.

* * * * *